US010854255B1

(12) United States Patent
Ong et al.

(10) Patent No.: US 10,854,255 B1
(45) Date of Patent: *Dec. 1, 2020

(54) VERTICAL SELECTOR STT-MRAM ARCHITECTURE

(71) Applicant: Spin Memory, Inc., Fremont, CA (US)

(72) Inventors: Adrian E. Ong, Pleasanton, CA (US); Andrew J. Walker, Mountain View, CA (US); Dafna Beery, Palo Alto, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/691,448

(22) Filed: Nov. 21, 2019

Related U.S. Application Data

(63) Continuation-in-part of application No. 16/457,544, filed on Jun. 28, 2019.

(51) Int. Cl.
| | |
|---|---|
| *G11C 11/16* | (2006.01) |
| *H01L 21/02* | (2006.01) |
| *G11C 11/40* | (2006.01) |
| *G11C 11/4074* | (2006.01) |

(52) U.S. Cl.
CPC ........ *G11C 11/161* (2013.01); *G11C 11/1655* (2013.01); *G11C 11/1657* (2013.01); *G11C 11/4074* (2013.01); *H01L 21/0257* (2013.01)

(58) Field of Classification Search
CPC ..... H01L 27/228; H01L 43/02; G11C 11/161; G11C 11/1659; G11C 11/1673; G11C 11/1693; G11C 11/1675

USPC ........................................................ 257/421
See application file for complete search history.

(56) References Cited

U.S. PATENT DOCUMENTS

| | | | | |
|---|---|---|---|---|
| 2012/0012806 | A1* | 1/2012 | Herner | H01L 45/148 257/4 |
| 2016/0268500 | A1* | 9/2016 | Furuhashi | H01L 27/228 |

OTHER PUBLICATIONS

Ong et al., U.S. Appl. No. 16/457,544, filed Jun. 28, 2019.
Non-Final Office Action from U.S. Appl. No. 16/457,544, dated Apr. 1, 2020.
Notice of Allowance from U.S. Appl. No. 16/457,544, dated Jul. 13, 2020.
International Search Report and Written Opinion from PCT Application No. PCT/US2020/039897, dated Jul. 30, 2020.

* cited by examiner

*Primary Examiner* — Caleen O Sullivan
(74) *Attorney, Agent, or Firm* — Zilka-Kotab, P.C.

(57) ABSTRACT

A magnetic memory array having a source-plane electrically connected with an array of channel selectors in two-dimensions. The array of channel selectors can be arranged in rows and columns with both the rows and columns being electrically connected with a source-plane. A memory element such as a two terminal resistive switching memory element can be electrically connected with each of the channel selectors. The source-plane can include a doped region formed in a surface of a semiconductor substrate and may also include an electrically conductive layer formed on the doped region. The use of such a planar, two-dimensional source-plane allows for greatly increased data density by eliminating the need to form separate source-line source lines for individual rows of channel selectors.

17 Claims, 5 Drawing Sheets

VERTICAL SELECTOR STT-MRAM ARCHITECTURE

FIELD OF THE INVENTION

The present invention relates to magnetic random-access memory (MRAM) and more particularly to a magnetic memory array architecture incorporating a source plane.

RELATED APPLICATIONS

The present Application is a Continuation in Part (CIP) of commonly assigned U.S. patent application Ser. No. 16/457,544 entitled VERTICAL SELECTOR STT-MRAM ARCHITECTURE, filed Jun. 28, 2019.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "0", whereas the high resistance state can be read as a "1". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

SUMMARY

The present invention provides a memory array that includes an electrically conductive source-plane, and an array of vertical semiconductor channel structures. The array also includes a plurality of memory elements, each being electrically connected with one of the vertical semiconductor channel structures. The vertical semiconductor channel structures are formed on and electrically connected with the source-plane in two-dimensions.

The source-plane can be formed in a two-dimensional plane such that it is electrically connected with each of the vertical semiconductor channel structures in both row and column directions. The source-plane can be formed as a doped layer or region formed in a surface of a semiconductor substrate, and may also include an electrically conductive metal layer formed over the doped region for reduced electrical resistance and increased current flow.

The use of a two-dimensional, planar source-plane advantageously allows for greatly increased data density by eliminating the need to form individual rows of separated source-lines. For example, when forming separate rows of source-lines as doped rows in a surface of a substrate a minimum spacing and width of the source-lines must be maintained as a result of electrical conduction and separation requirements and as a result of limitations of currently available manufacturing processes.

These and other features and advantages of the invention will be apparent upon reading of the following detailed description of the embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
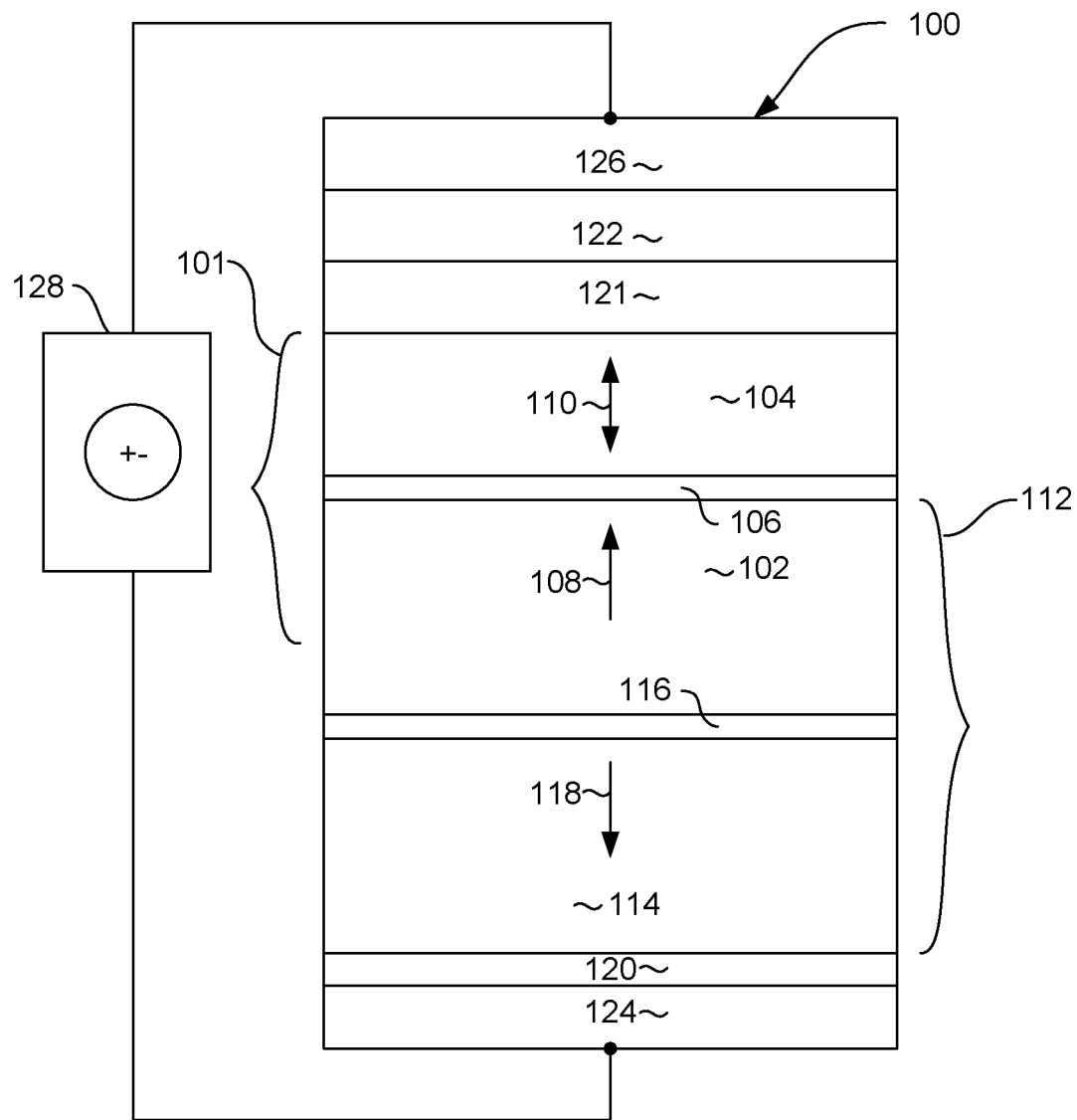
FIG. 1 is a schematic, cross sectional view of a two terminal resistive switching memory element according to one possible embodiment.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is in a direction opposite to the direction of magnetization 118 of the bottom SAF layer 114.

A seed layer 120 may be provided near the bottom of the memory element 100 to initiate a desired crystalline structure in the above deposited layers. A capping layer 121 may be provided near the top of the memory element 100 to protect the underlying layers during manufacture, such as during high temperature annealing and from exposure to ambient atmosphere. The capping layer 121 can be constructed of, for example, Ta. In addition, a Ru hard mask layer 122 is formed at the top of the memory element 100 over the capping layer 121. Optionally, the Ru layer 122 can serve as both a hard mask layer and as a capping layer 121, eliminating the need for a separate capping layer 122. The use of Ru provides several advantages over other hard mask materials layer materials. For example, the Ru hard mask layer 122 does not form an electrically insulating oxide, and therefore remains a good electrical conductor even after various processing steps that would oxidize other hard mask materials. Therefore, the Ru hard mask 122 can remain in the finished memory element 100 without imparting any parasitic resistance. In addition, Ru has a high resistance to removal by ion beam etching (also known as ion milling). This advantageously allows the hard mask layer to be thinner, which in turn allows for lower spacing of memory elements and increased data density. These advantages of such a Ru capping layer 122 will be more readily appreciated with regard to various methods of manufacturing magnetic memory elements as described in greater detail herein below.

In addition, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

The above description of a magnetic tunnel junction is merely an example of one type of two terminal resistive switching memory element. Other types of two terminal resistive switching memory elements can also be used, such as: ReRAM; Correlated Electron RAM (CBRAM); Conductive Bridge RAM (CBRAM); or memristor structures. ReRAM can be is a resistive switch which can be based on metal filaments such as silver in amorphous silicon. Other types of ReRAM include metal filaments in chalcogenide materials. In addition ReRAM element can be constructed using HfO with a titanium buffer layer. Various forms of tantalum oxide have also been used as an insulator between two metal electrodes. ReRAM can also be based on transition metal oxides (TMO) such as perovskite manganites and titanates. Correlated Electron RAM (CERAM) can be based on transition metal oxides such as perovskite manganites and titanates. Conductive Bridge RAM (CBRAM) can be formed using materials such as silver-doped germanium selenide glasses and copper-doped germanium sulfide electrolytes.

Figure 2:
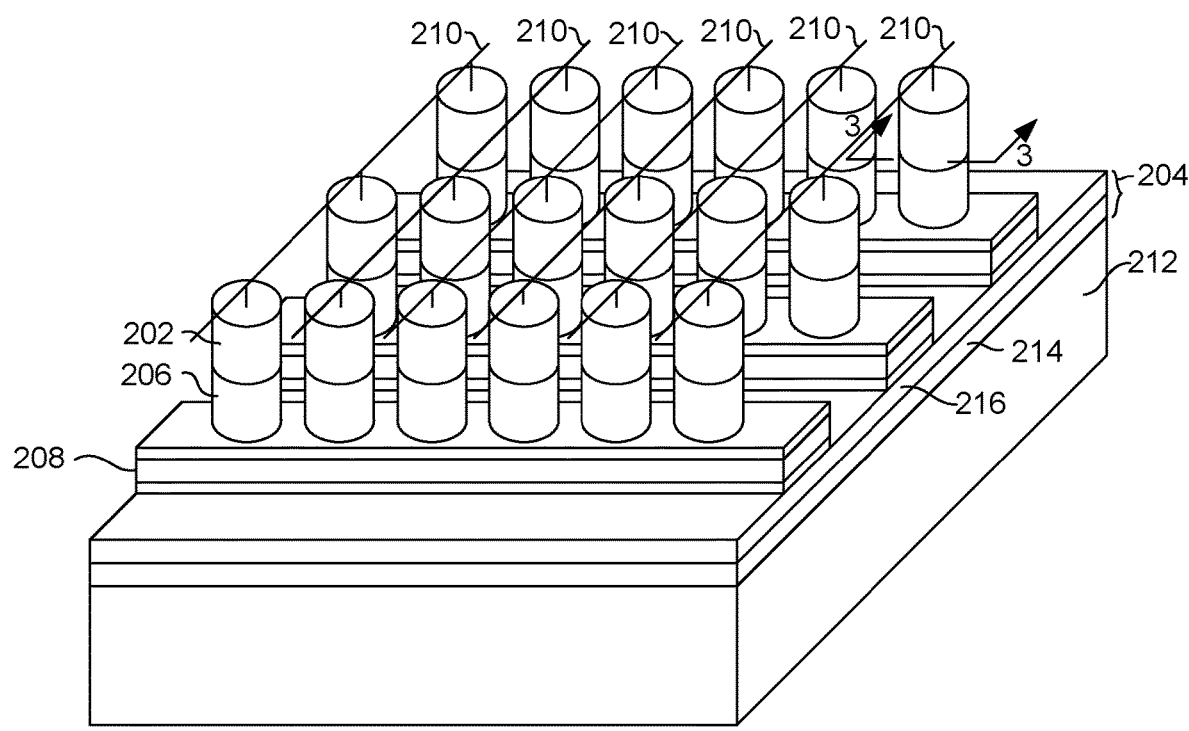
FIG. 2 is a perspective, schematic view of a substrate having a source-plane and a plurality of selector transistors and memory elements formed thereon.

FIG. 2 is a perspective view showing an array of memory elements 202 connected with a two-dimensional, planar source-line 204 via electrical contacts 206. The memory element can be any type of two terminal resistive switching memory element, such as those described above. Word lines 208 selectively connect the memory elements 202 and contacts 206 with the source-plane 204 via vertical transistor channel selectors (not show in FIG. 2). A plurality of electrically conductive bit-lines 210 are electrically connected with the memory elements 202 at an end opposite the vertical transistor channel selector and source-plane 204.

The source-plane 204 is formed on a substrate 212, which can be a semiconductor substrate such as silicon (Si). The source-plane 204 can include a first layer 214, which can be a doped (e.g. n-doped) layer of the semiconductor substrate 212. The source-plane 204 can also include an option second layer 216, which can be an electrically conductive metal strapped to the n-doped layer 204. While optional, the second electrically conductive metal layer 216 provides additional electrical conductivity to provide a write current to the memory elements 202.

The push for ever greater data capacity has led a push to increase the density of memory elements 202 in an array. In such arrays, source-lines have previously been formed as one-dimensional lines connecting with a row or column of memory elements 202. Such source-lines have been constructed by forming doped region (e.g. n-doped) as a plurality of lines in a substrate. However, the density of such linear source-lines has been limited both by manufacturing limitations and also by electrical conductivity and separation limitations.

Figure 3:
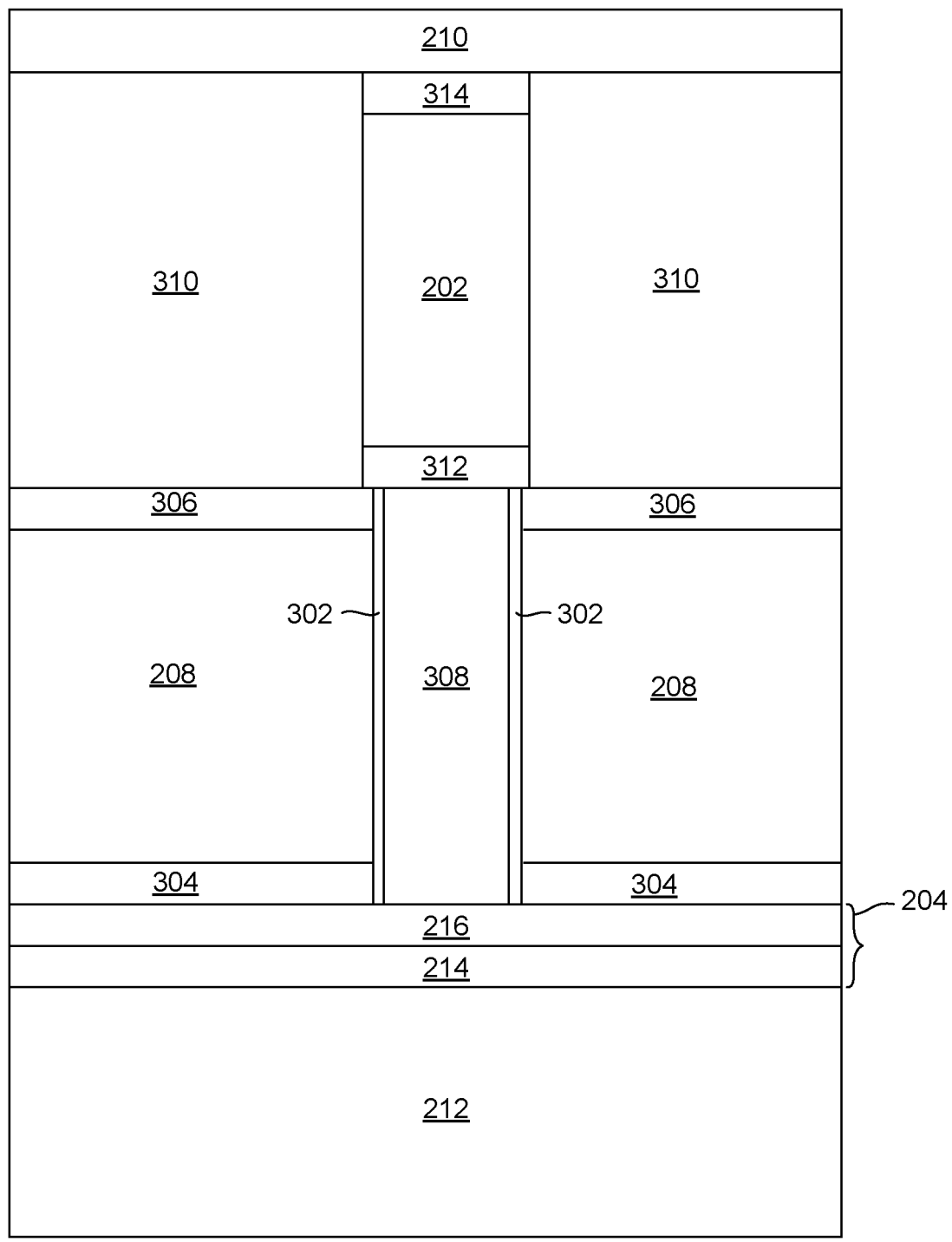
FIG. 3 is enlarged cross-sectional view of taken from line 3-3 of FIG. 2, showing a word-line, selector transistor and tunnel junction memory element formed thereon.

The present invention however, greatly increases the potential for increased data density by incorporating the two-dimensional, source-plane 204 without the need to form separate patterned linear, one dimensional source-lines. FIG. 3 shows a side cross-sectional view as seen from line 3-3 of FIG. 2 in order to describe the memory element 202, connector 206, word line 208 and source-line 204 in greater detail.

FIG. 3 shows the substrate 212, which as mentioned above can be a semiconductor substrate such as a Si substrate. A doped layer 214 is formed in an upper surface of the substrate 212 and an optional (but preferable) electrically conductive layer 216 can be formed over (strapped with) the doped layer 214. The electrically conductive metal layer 216 can be deposited by a process such as sputter deposition. A vertical semiconductor channel structure is formed over the source-plane layer 304. The vertical channel structure includes a vertical semiconductor column 308, which is preferably Si having source and drain regions at upper and lower ends of the semiconductor column 308. The semiconductor column 308 is surrounded at its outer side by a gate dielectric layer 302, which can be an oxide or nitride layer such as $SiO_2$ or $Si_3N_4$. A gate line 208 is formed adjacent to the semiconductor column 308 and gate dielectric 302 such that the gate dielectric layer 302 separates the gate line 208 from the semiconductor column 308. The gate line 208 can be an n-doped semiconductor layer such as n-doped Si or could also be an electrically conductive material such a metal. A dielectric layer 304 formed at the bottom of the gate line 208 separates the gate line from the underlying source-line layer 204. The dielectric layer 304 can be an oxide or nitride such as $SiO_2$ or $Si_3N_4$. Another dielectric layer 306 may be formed at the top of the gate line 208 in order to electrically isolate the gate line 208 from surrounding structures. The upper dielectric layer can be an oxide or nitride such as $SiO_2$ or $Si_3N_4$. The semiconductor column 308 can be formed by selective epitaxial growth, or can be formed by deposition of a polycrystalline semiconductor (e.g. polycrystalline Si) followed by an annealing process. Upper and lower portions of the semiconductor column 308 can be doped to form source and drain regions of the semiconductor column 308.

The memory element 202 can be formed over the semiconductor column 308. A bottom electrode 312 can be formed at the bottom of the memory element 202 to provide electrical connection between the memory element 202 and the semiconductor column 308. The bottom electrode 312 can be formed of an electrically conductive metal such as TaN. Additional electrically conductive contact structures (not shown) can be provided between the memory element 202 and semiconductor column 308, such as between the bottom electrode 312 and the semiconductor column 308. An upper electrode 314, can be formed at the top of the memory element 202 to provide electrical connection between the memory element 202 and the bit-line 210 described previously with reference to FIG. 2. The upper electrode 314 can be formed of a material such as TaN and can function as both an upper electrode and as a hard mask for the construction of the memory element 202. The bit-line 210 can be an electrically conductive, non-magnetic metal. A dielectric isolation layer 310 can be formed at the sides of the memory element 202 to surround the memory element 202 to provide electrical isolation between the memory element 202 and other adjacent memory elements in the array. The dielectric isolation layer 310 can be constructed of one or more oxide or nitride layers such as SiOx or SiNx.

The memory element 202 can be a magnetic tunnel junction (MTJ) or any two terminal resistive switching memory elements, such as those described above. In order to write data to the memory element 202 a current is applied to the memory element between the source plane 204 and the bit line 210. The direction of current flow through the memory element 202 determines whether the memory element will be switched to a high resistance state or to a low resistance state. In order to read a data bit from the memory element, a read current (smaller than the write current) is applied across the memory element 202 between the bit line 210 and source-plane 204. The semiconductor column 308, surrounding gate dielectric 302 and gate line 208 together provide a transistor selector for selectively applying the write current to the memory element. When a voltage is applied to the gate layer 208, the transistor is switched on, allowing electrical current flow through the semiconductor channel 308. The gate layer 208 can be part of or connected with a word-line of the memory array.

Figure 4:
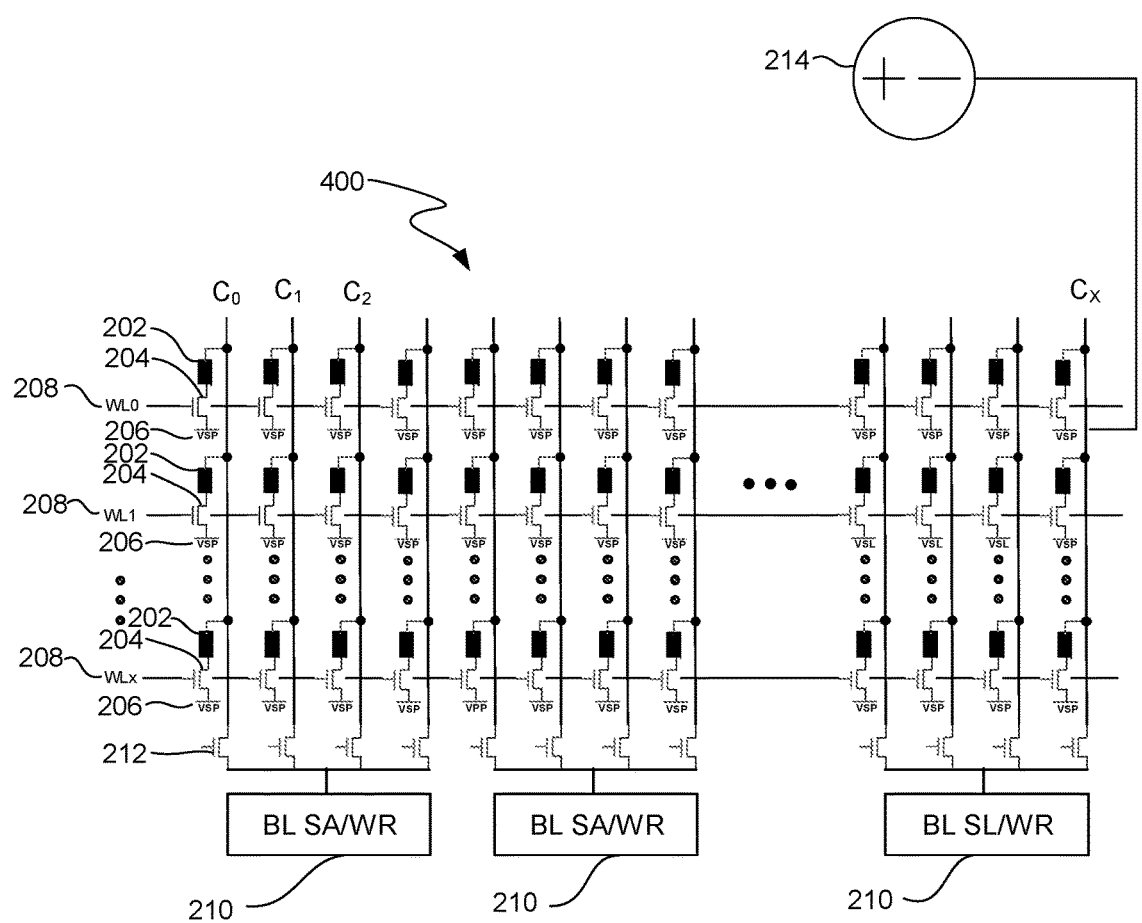
FIG. 4 is a schematic illustration of an array of memory elements connected with a source-plane.

FIG. 4 shows an electrical schematic of a memory array 400 incorporating a source-plane. The array 400 includes a plurality of memory elements 402 arranged in rows R0, R1 . . . Rx, and columns C0, C1, C2 . . . Cx. Again, the memory elements 402 can be any type of two terminal resistive switching memory element, such as those described above. Each of the memory elements 202 is connected at one end (e.g. bottom end) with a channel selector 204, which can have a construction similar to that of FIG. 3 previously described. Each channel selector 204 selectively connects its associated magnetic memory element with a source-plane VSP 206. The channel selector functions as a switch to apply source-plane voltage to the memory element 202 or to disconnect the memory element 202 from the source-plane 206. Each of the channel selectors 204 is connected with a word line that is functional to apply a gate voltage to the channel selector to turn the channel selector to an "on" state or to remove gate voltage to turn the channel selector 204 to an "off" state.

With continued reference to FIG. 4, one or more bit-line 110 multiplexers 210 are connected with one or more columns of memory elements. The bit-line voltage is applied to an end of its respective memory element 202 that opposite the end to which the source-plane voltage is connected. A plurality of bit-line channel selectors (transistors) 212 can be provided to select which column (C0 . . . Cx) of memory elements 202 the bit-line voltage is applied to.

It is worth reiterating that the source-planes 206 schematically represent a two-dimensional source-plane that is connected to all of the memory element/channel selector combinations 202, 204 in the array, which can be in the form of the planar structure 204 described above with reference to FIGS. 2 and 3. The selection of a particular memory element 202 is provided by controlled application of source-plane voltage via an associated channel selector activated by a voltage from the associated word-line 208 and by application of a bit line voltage through activation of an associated bit-line channel selector 212.

Figure 5:
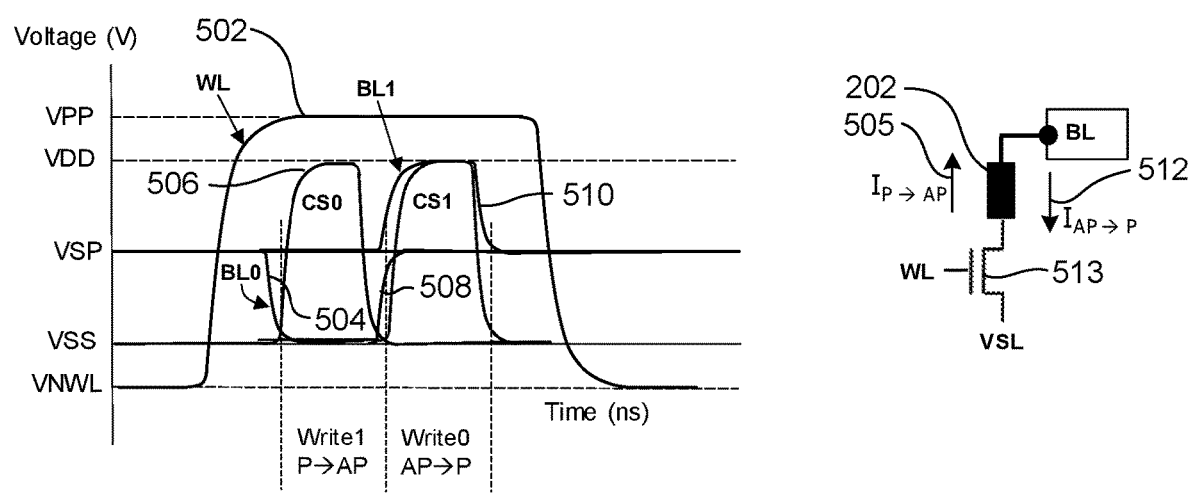
FIG. 5 is a graph illustrating data read and write speeds as a function of voltage.

It should also be pointed out that the source-plane 206 can be connected with a source-plane voltage source 214 or could alternatively be connected with ground. The voltage needed to provide a current through the memory element 202 sufficient to switch the memory state of the memory element is referred to as the switching voltage $V_{SW}$. The source-plane voltage should be equal to or greater than $V_{SW}$. Referring to FIG. 5. $V_{DD}$, which is the supply voltage to the bit-lines, should be greater or equal to $2 \times V_{SW}$. VSP can be adjusted to provide higher switching voltage to write either "1"s or "0"s as needed. Therefore, when writing to an individual memory element 202 the amount of net voltage applied to the memory element 202 must be equal to at least the switching voltage $V_{SW}$. If the source-plane 206 is connected with a voltage source 214, that voltage source provides a voltage $V_{SP}$ that is at least equal to $V_{SW}$. In order to write in one direction, the associated channel selector 204 is opened and the source voltage applies a voltage $V_{SP}$, with the bit line providing zero voltage. Therefore, in that case, the voltage $V_{SP}$ (e.g. in an upward direction through the memory element 202) is sufficient to switch the memory state of the memory element. To switch the memory element to an opposite state, the bit-line is configured to provide a voltage that is at least $2(V_{SW})$ or twice the source voltage. In this case, then, the net voltage through the memory element will be $V_{SP}$ in the opposite direction, thereby providing switching in an opposite direction.

On the other hand, if the source-plane 206 is connected to ground, it will provide no effective voltage. In that case, the bit-line and associated circuitry are configured to provide a bit-line voltage that is either positive or negative depending upon the desired magnetic state. The bit-line will be configured to provide a voltage of either $+V_{SP}$ or $-V_{SP}$, where the absolute value of $V_{SP}$ is equal to or greater than the switching voltage $V_{SW}$.

FIG. 5 shows a graph of switching characteristics for a memory element in a memory array such as described above, and also shows a schematic of an individual memory element showing currents associated with switching between a "1" and "0" memory state. Line 502 indicates the word-line voltage which is applied to open the channel selector 206 shown in FIGS. 2, 3 and 4 to allow the flow of current through the magnetic sensor 202. Line 504 is a bit line voltage and line 506 is column address select 0 (CS0) when writing a "0" memory state. In this case, the source plane is maintained at $V_{SP}$ voltage and the bit-line has a low voltage. This allows current flow in an upward direction through the memory element 202 as indicated by arrow 505, thereby causing the memory element 202 to switch from a low resistance state to a high resistance state.

On the other hand, line 508 in the graph shows BL0 (504) returning to $V_{SP}$ voltage and line 510 indicates the bit-line 1 (BL1) voltage when switching from high resistance state to a low resistance state ("1" to "0"). These voltage curves correspond to the arrow 512 on the adjacent schematic, wherein current in a downward direction switches the memory element from high resistance ("1") state to a low resistance ("0") state.

The word-line, WL, starts out at negative voltage, $V_{NWL}$, (around −0.2V to −0.7V). The purpose of the negative gate voltage is to reduce the access transistor's sub-threshold leakage current. WL is driven to $V_{PP}$ voltage, which is greater than $V_{DD}$ plus a voltage greater than one or two times the $V_T$ of the access transistor, to access the memory cell. All bit-lines are initially pre-charged to $V_{SP}$ voltage. The source plane is a power plane for supplying or sinking current depending on the selected bit-line voltage. $V_{SP}$ is a constant supply at approximately half $V_{DD}$ voltage. If the bit-line voltage is driven to $V_{DD}$, then current will flow from bit-line through the memory element 202 and access transistor 513 to the source plane as indicated by arrow 512. If the bit-line is driven to $V_{SS}$, then current will flow from the source plane through the access transistor 513 and memory element 202 to the bit-line as indicated by arrow 505. The waveform in FIG. 5 shows bit-line 0 (BL0, 504) being driven LOW to write a logic "1" in column address select 0 (CS0). Next, bit-line 1 (BL1, 510) is driven HIGH to write a logic "0" in column address select 1 (CS1, 508). After writing, the bit-lines are pre-charged to $V_{SP}$. The column address lines are unselected and driven to $V_{SS}$. The WL is then turned off to be driven to $V_{NWL}$.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A memory array, comprising:
an electrically conductive source-plane;
an array of vertical semiconductor channel structures; and
a plurality of memory elements, each of the memory elements being electrically connected one of the vertical semiconductor channel structures; wherein
the vertical semiconductor channel structures are formed on and connected with the source-plane in two dimensions;
wherein the source-plane comprises an n-doped region formed in a surface of a semiconductor substrate.

2. The memory array as in claim 1, wherein the array of vertical semiconductor channel structures is arranged as a plurality of rows and a plurality of columns that are generally perpendicular with the rows.

3. The memory array as in claim 1, further comprising an electrically conductive contact structure connecting each of the memory element structures with one of the vertical semiconductor channel structures.

4. The memory array as in claim 1, wherein the source-plane further a layer of electrically conductive metal formed over the n-doped region of the semiconductor substrate.

5. The memory array as in claim 1, further comprising an electrically conductive word-line connected with each of the vertical semiconductor channel structures.

6. The memory array as in claim 1 further comprising an electrically conductive bit-line connected with each of the memory elements at an end of the memory element that is opposite the vertical semiconductor channel structure.

7. The memory array as in claim 1, wherein the source-plane is electrically connected with a voltage source.

8. The memory array as in claim 1, wherein the source-plane is electrically connected with a ground.

9. The memory array as in claim 1, wherein the memory elements are two terminal resistive switching memory elements.

10. A memory array, comprising:
an electrically conductive source-plane;
an array of vertical semiconductor channel structures; and
a plurality of memory elements, each of the memory elements being electrically connected one of the vertical semiconductor channel structures; wherein
the vertical semiconductor channel structures are formed on and connected with the source-plane in two dimensions;
wherein each of the vertical semiconductor channel structures includes a semiconductor column structure and a gate dielectric layer surrounding the semiconductor column structure, wherein the semiconductor column structure is formed by selective epitaxial growth.

11. A memory array, comprising;
a two-dimensional array of channel selectors arranged in rows and columns;
a two-dimensional source-plane electrically connected with the two-dimensional array of channel selectors in both the row and column direction; and
a plurality of memory element structures formed on the two-dimensional array of channel selectors, wherein the memory element structures are two terminal resistive switching memory elements;
wherein the channel structures include a semiconductor formed by selective epaxial growth.

12. The memory array as in claim 11, wherein the two-dimensional source-plane is formed in a plane on a surface of a semiconductor substrate.

13. The memory array as in claim 11, wherein the two-dimensional source-plane is formed in a two-dimensional plane on a semiconductor substrate and further comprises a doped region formed in a surface of the semiconductor substrate and a layer of electrically conductive metal formed on the doped region.

14. The memory array as in claim 11, wherein the two-dimensional source-plane is electrically connected with a voltage source.

15. The memory array as in claim 11, wherein the two-dimensional source-plane is electrically connected with a ground.

16. The memory array as in claim 11, further comprising an electrically conductive bit-line connected with each of the magnetic memory elements at an end opposite the associated channel selector.

17. The memory array as in claim 11, further comprising:
a plurality of electrically conductive word lines, each electrically conductive word line being electrically connected with a row of the channel structures; and
a plurality of bit lines, each of the bit lines being electrically connected with a column of magnetic memory elements, wherein the column is generally orthogonal with the row.

* * * * *

UNITED STATES PATENT AND TRADEMARK OFFICE
CERTIFICATE OF CORRECTION

PATENT NO. : 10,854,255 B1
APPLICATION NO. : 16/691448
DATED : December 1, 2020
INVENTOR(S) : Adrian E. Ong et al.

Page 1 of 1

It is certified that error appears in the above-identified patent and that said Letters Patent is hereby corrected as shown below:

In the Specification

Column 7, Line 34, please replace "110 multiplexers" with --I/O multiplexers--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*